US009627531B1

(12) United States Patent
Chiang et al.

(10) Patent No.: US 9,627,531 B1
(45) Date of Patent: Apr. 18, 2017

(54) FIELD-EFFECT TRANSISTOR WITH DUAL VERTICAL GATES

(71) Applicant: Taiwan Semiconductor Manufacturing Company, Ltd., Hsin-Chu (TW)

(72) Inventors: Hung-Li Chiang, Taipei (TW); Chih Chieh Yeh, Taipei (TW); Cheng-Yi Peng, Taipei (TW); Tzu-Chiang Chen, Hsinchu (TW); Yee-Chia Yeo, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/928,449

(22) Filed: Oct. 30, 2015

(51) Int. Cl.
| | | |
|---|---|---|
| H01L 29/78 | (2006.01) |
| H01L 29/66 | (2006.01) |
| H01L 27/00 | (2006.01) |
| H01L 27/092 | (2006.01) |
| H01L 21/8238 | (2006.01) |

(52) U.S. Cl.
CPC .. H01L 29/7831 (2013.01); H01L 21/823807 (2013.01); H01L 21/823828 (2013.01); H01L 27/092 (2013.01); H01L 29/66484 (2013.01); H01L 29/66666 (2013.01); H01L 29/7827 (2013.01)

(58) Field of Classification Search
CPC ........... H01L 29/7831; H01L 29/66484; H01L 29/66666; H01L 29/7827; H01L 27/092
See application file for complete search history.

(56) References Cited

U.S. PATENT DOCUMENTS

| 5,293,053 | A | * | 3/1994 | Malhi | H01L 27/0688 257/330 |
| 5,466,961 | A | * | 11/1995 | Kikuchi | H01L 27/115 257/329 |
| 5,581,101 | A | * | 12/1996 | Ning | H01L 27/1203 257/347 |
| 5,598,037 | A | * | 1/1997 | Kikuchi | H01L 27/115 257/306 |
| 5,739,567 | A | * | 4/1998 | Wong | G11C 11/5621 257/316 |
| 5,918,115 | A | * | 6/1999 | Kikuchi | H01L 27/115 257/E27.103 |

(Continued)

*Primary Examiner* — Ida M Soward
(74) *Attorney, Agent, or Firm* — Haynes and Boone, LLP

(57) ABSTRACT

A semiconductor device includes an n-type vertical field-effect transistor (FET) that includes: a first source/drain feature disposed in a substrate; a first vertical bar structure that includes a first sidewall and a second sidewall disposed over the substrate; a gate disposed along the first sidewall of the first vertical bar structure; a second vertical bar structure electrically coupled to the first vertical bar structure; and a second source/drain feature disposed over the first vertical bar structure; and a p-type FET that includes; a third source/drain feature disposed in the substrate; a third vertical bar structure that includes a third sidewall and a fourth sidewall disposed over the substrate; the gate disposed along the third sidewall of the third vertical bar structure; a fourth vertical bar structure electrically coupled to the third vertical bar structure; and a fourth source/drain feature disposed over the third vertical bar structure.

20 Claims, 15 Drawing Sheets

(56) References Cited

U.S. PATENT DOCUMENTS

| | | | |
|---|---|---|---|
| 6,300,198 B1* | 10/2001 | Aeugle | H01L 29/7827 257/E21.41 |
| 6,373,099 B1* | 4/2002 | Kikuchi | H01L 27/115 257/331 |
| 6,406,962 B1* | 6/2002 | Agnello | H01L 21/84 257/E21.703 |
| 6,632,712 B1* | 10/2003 | Ang | H01L 21/823885 257/328 |
| 6,773,994 B2* | 8/2004 | Chittipeddi | H01L 27/092 257/331 |
| 6,903,411 B1* | 6/2005 | Chyan | H01L 21/76895 257/327 |
| 6,943,407 B2* | 9/2005 | Ouyang | H01L 21/823807 257/329 |
| 7,056,783 B2* | 6/2006 | Layman | H01L 21/823437 257/E21.41 |
| 7,374,990 B2* | 5/2008 | Tang | H01L 27/10876 257/E21.411 |
| 7,667,271 B2 | 2/2010 | Yu et al. | |
| 7,767,525 B2* | 8/2010 | Manning | H01L 27/10876 257/E21.645 |
| 7,910,453 B2 | 3/2011 | Xu et al. | |
| 7,994,568 B2* | 8/2011 | Chung | H01L 29/66666 257/328 |
| 8,188,552 B2* | 5/2012 | Huang | H01L 27/10876 257/401 |
| 8,212,298 B2* | 7/2012 | Masuoka | H01L 21/823828 257/300 |
| 8,377,779 B1 | 2/2013 | Wang | |
| 8,399,931 B2 | 3/2013 | Liaw et al. | |
| 8,409,948 B2* | 4/2013 | Fischer | H01L 21/823425 438/206 |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2010/0052055 A1* | 3/2010 | Takeuchi | H01L 21/823487 257/351 |
| 2013/0140628 A1* | 6/2013 | Higashino | H01L 29/7827 257/329 |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0141362 A1* | 5/2016 | Gogoi | H01L 29/0657 257/329 |
| 2016/0293756 A1* | 10/2016 | Liu | H01L 29/7827 |

* cited by examiner

FIELD-EFFECT TRANSISTOR WITH DUAL VERTICAL GATES

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

The semiconductor integrated circuit industry has produced numerous developments in effort to continue the process of scaling. One of the developments is the potential replacement or supplementation of the conventional planar metal-oxide-semiconductor field-effect transistor by the vertical field-effect transistor. However, existing vertical field-effect transistors have not been satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
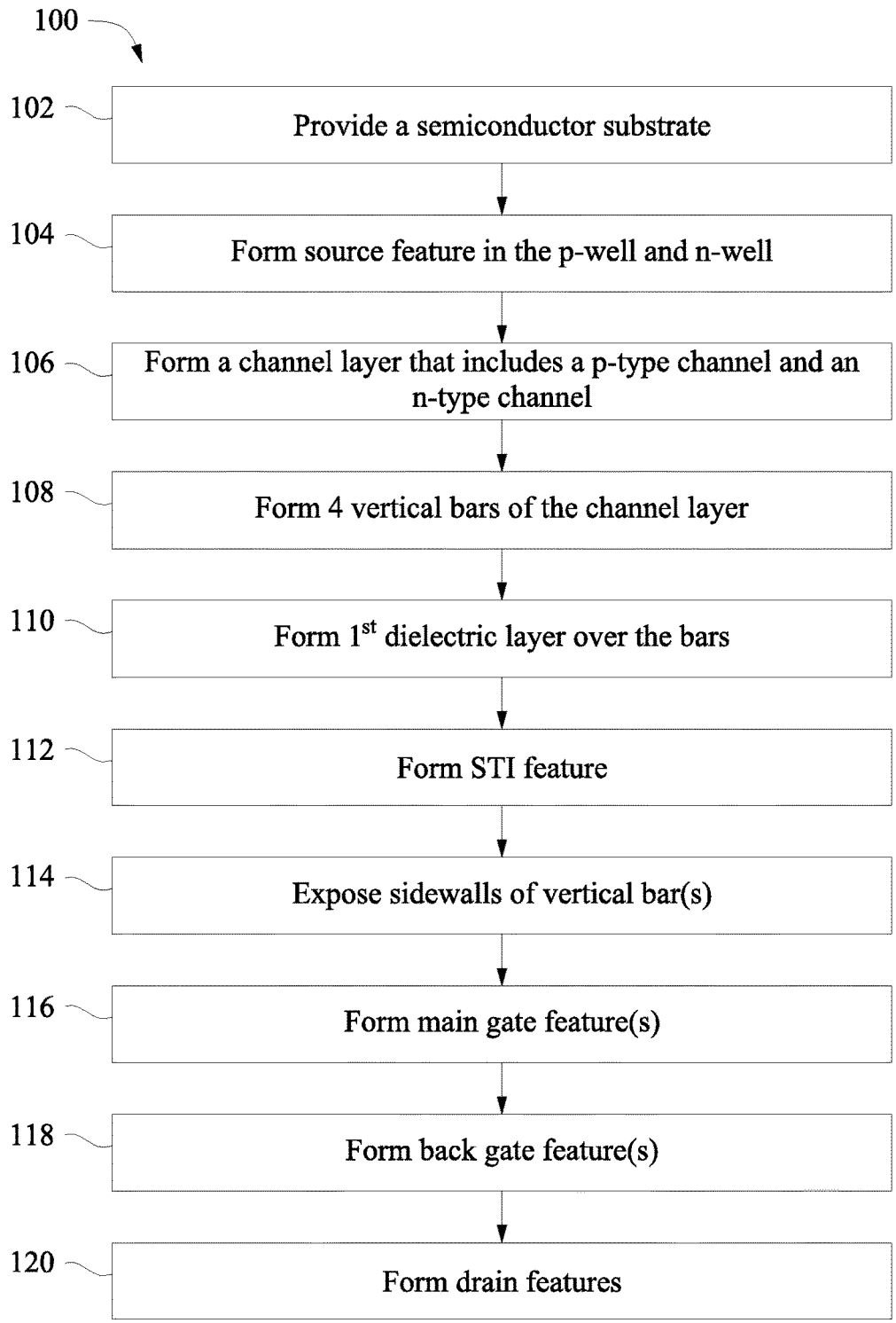
FIG. 1 illustrates a flowchart of a method for fabricating a semiconductor device that includes two vertical field-effect transistors that each has two vertical gates according to various embodiments of the present disclosure.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 2A:
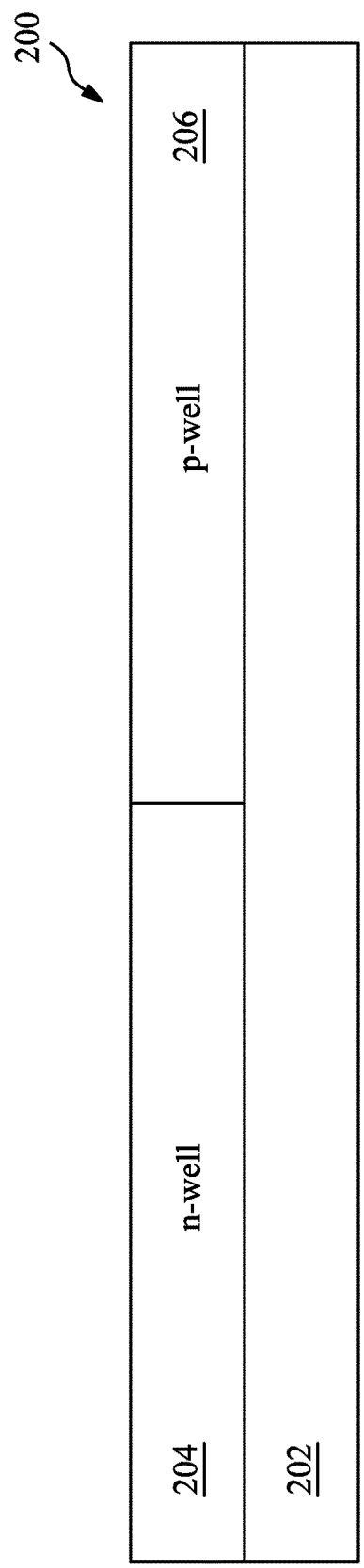
FIGS. 2A, 2B, 2C, 2D, 2E, 2F, 2G, 2H, 2I, 2J, 2K, 2L, 2M, 2N, 2O are cross-sectional diagrams of a semiconductor substrate undergoing various processes in order to form the semiconductor device, fabricated by the method of FIG. 1, according to various embodiments of the present disclosure.

FIG. 1 is a flowchart of a method 100 of forming a semiconductor device 200 that includes a vertical N-type field-effect transistor (NFET) and a vertical P-type FET (PFET) and each of the transistors includes at least two gates according to various aspects of the present disclosure in one or more embodiments. The method 100 is described with reference to FIG. 1 and in conjunction with FIGS. 2A, 2B, 2C, 2D, 2E, 2F, 2G, 2H, 2I, 2J, 2K, 2L, 2M, 2N, and 2O. FIGS. 2A-2O are cross sectional views of forming the semiconductor device 200 by the method 100 according to some embodiments. It is understood that additional steps can be provided before, during, and/or after the method 100, and some of the steps described can be replaced, eliminated, and/or moved around for additional embodiments of the method 100.

Referring to FIGS. 1 and 2A, the method 100 begins at operation 102 by providing a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, in the illustrated embodiment of FIG. 2A, different doping profiles (that is, n-well 204 and p-well 206) may be formed on the substrate 202 in regions designed for different device types (e.g., n-well 204 for a p-type field effect transistor (PFET) and p-well 206 for an n-type field effect transistor (NFET)). The suitable doping may include ion implantation of dopants and/or diffusion processes. Substrate 202 may include at least one isolation feature (e.g., shallow trench isolation (STI) features) interposing the regions providing different device types. In some embodiments, the substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Figure 2B:
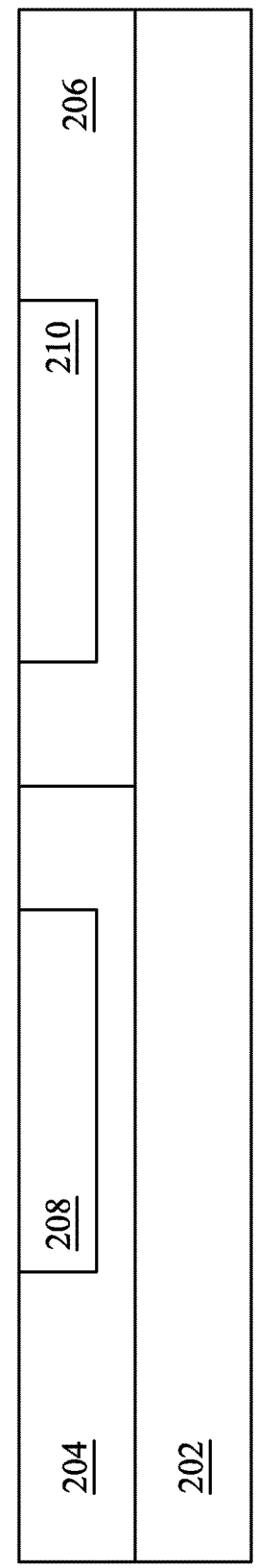

Referring now to FIGS. 1 and 2B, the method 100 proceeds to operation 104 with forming source/drain feature (s) in the n-well 204 and the p-well 206. In the illustrated embodiment of FIG. 2B, a p-type region 208 is formed in the n-well 204 and an n-type region 210 is formed in the p-well 206. Such formed p-type and n-type regions 208 and 210 may be used to form source/drain features for designed device types. For example, the p-type region 208 may subsequently be used as a source/drain feature for a later formed PFET and, the n-type region 210 may subsequently be used as a source/drain feature for a later formed NFET. In some embodiments, the source/drain features 208/210 may be in-situ doped during an epitaxial process. For example, in some embodiments, the p-type source/drain feature 208 may be doped with boron or another p-type dopant; the n-type source/drain feature 210 may be doped with phosphorous or another n-type dopant. In some alternative embodiments, the source/drain features 208/210 are not in-situ doped, and instead an implantation process is performed to dope the source/drain features 208/210.

Figure 2C:
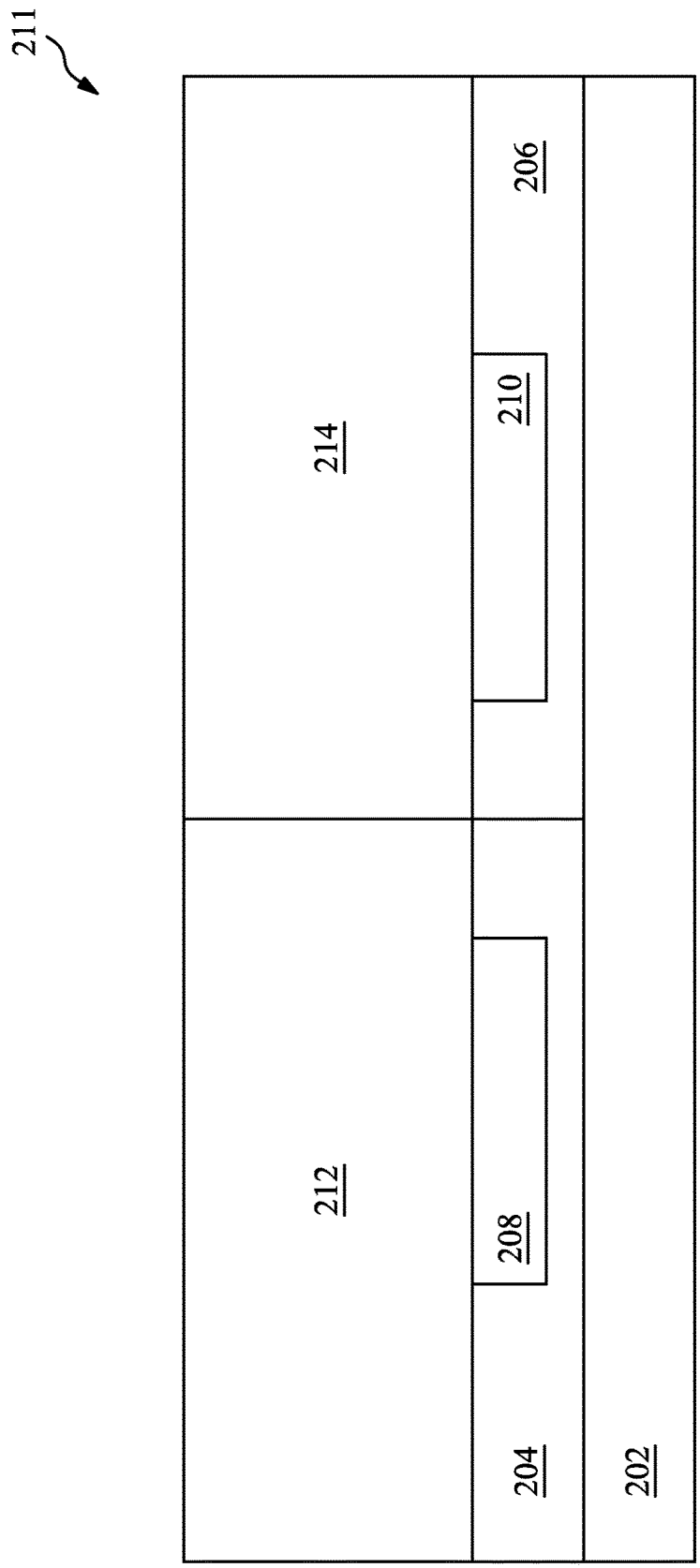

Referring now to FIGS. 1 and 2C, the method 100 proceeds to operation 106 with forming a channel layer 211 over the substrate 202. In some embodiments, the channel layer 211 is formed of the same material as the material of n-well 204 and p-well 206 such as, for example, silicon. In other embodiments, channel layer 211 is formed of other materials such as germanium, silicon germanium, and/or III-V compound semiconductor materials. In some specific embodiments, the channel layer 211 is an epitaxially grown pure silicon layer. The forming of channel layer 211 may include using a molecular beam epitaxy (MBE) process, a metalorganic chemical vapor deposition (MOCVD) process, and/or other suitable epitaxial growth processes.

More specifically, operation 106 may include forming p-type channel layer 212 and n-type channel layer 214 as illustrated in FIG. 2C. Such a formation of the p-type channel layer 212 and the n-type channel layer 214 may include a series of processes such as, for example, a deposition of hardmask/photoresist layer over the channel layer 211, a patterning process (e.g., a photolithography process), an etching process, and at least an implantation and/or diffusion process with dopants for each of the p-type channel layer 212 and the n-type channel layer 214. In some embodiments, the p-type channel layer 212 is implanted with the same dopant (e.g., boron) as the p-type region 208, and the n-type channel layer 214 is implanted with the same dopant (e.g., phosphorous) as the n-type region 210. In other embodiments, the p-type channel layer 212 is implanted with a different dopant than the p-type region 208 and the n-type channel layer 214 is implanted with a different dopant than n-type region 210. Furthermore, the concentration of the p-type dopant in the p-type channel layer 212 may be the same as or may be different than the concentration of the p-type dopant in the p-type region 208. Similarly, the concentration of the n-type dopant in the n-type channel layer 214 may be the same as or may be different than concentration of the n-type dopant in the n-type region 210.

Figure 2D:
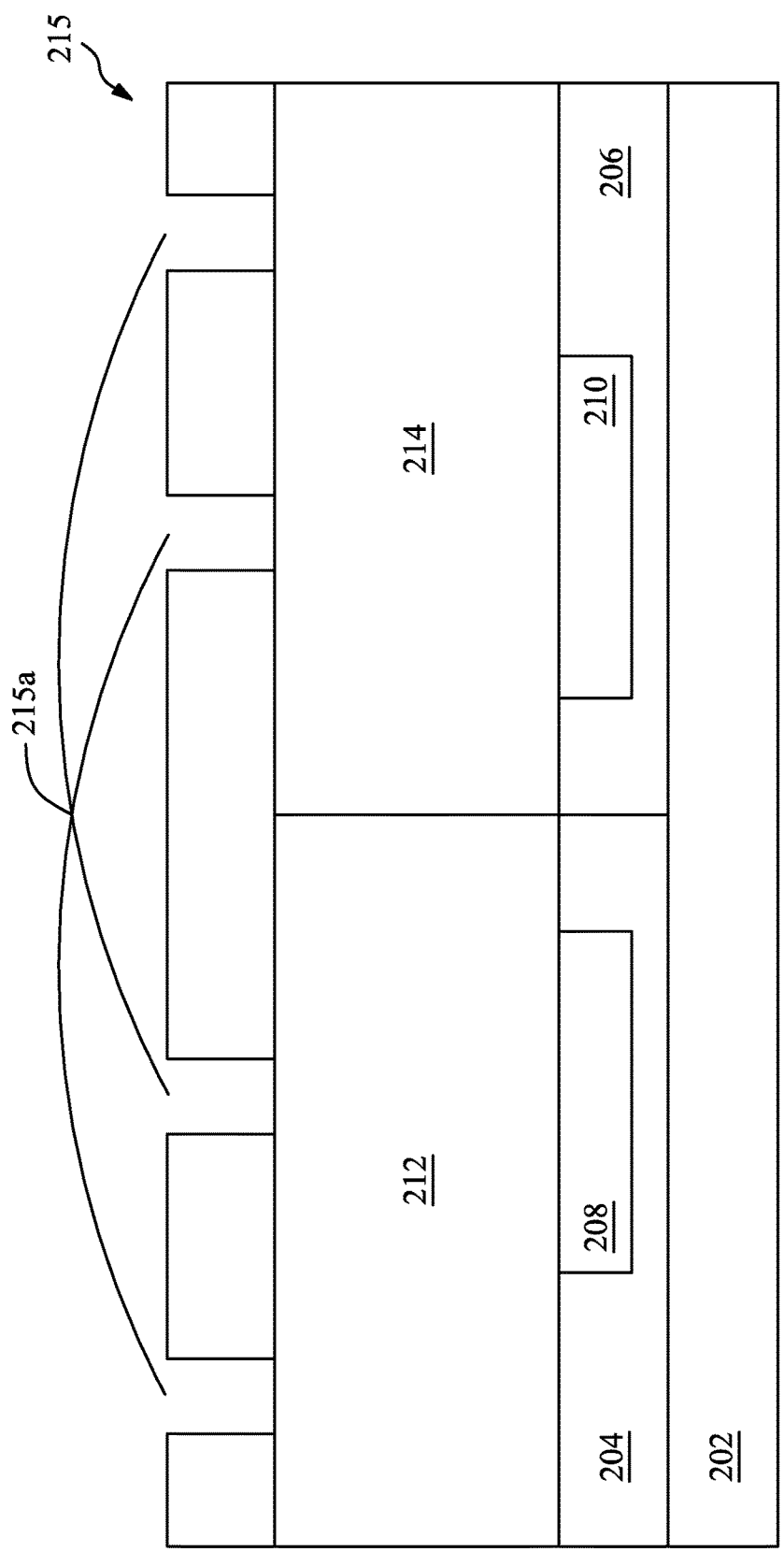
Figure 2E:
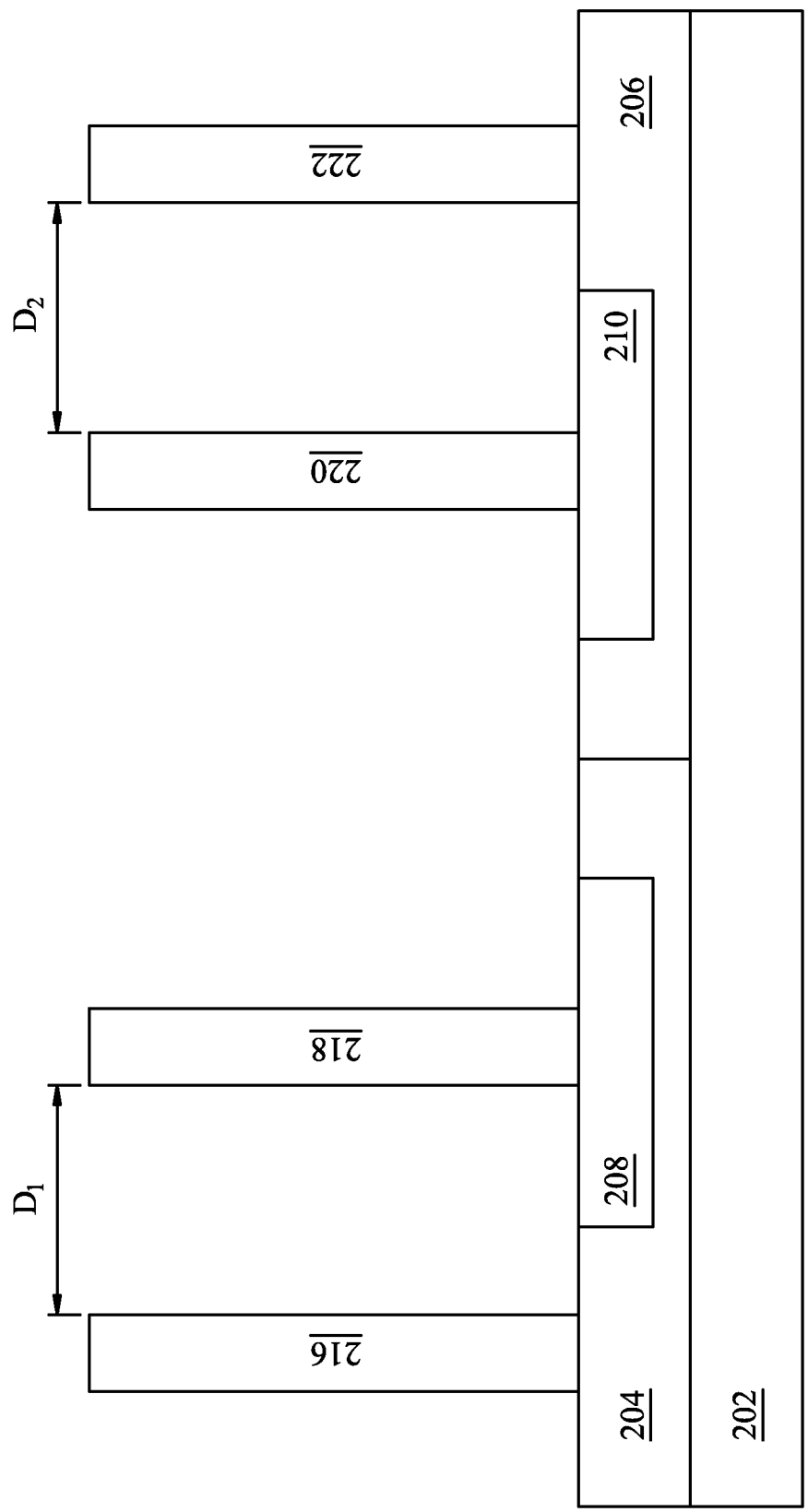

Referring now to FIGS. 1, 2D and 2E, the method 100 proceeds to operation 108 with patterning p-type channel layer 212 and n-type channel layer 214 to form four vertical bars (or columns) 216, 218, 220, and 222. The formation of the vertical bars 216 to 222 includes a dry etching process applied to exposed portions (215a) of p-type channel layer 212 and n-type channel layer 214 through a patterned mask layer 215 (e.g., a hardmask layer). The dry etching process may include a plasma etch process using $CF_4$, $SF_6$, $Cl_2$, $O_2$, other gas as an etch gas, or combination thereof. As depicted, the dry etching process is also a selective etch, such that channel layer 211 (e.g. p-type channel layer 212 and n-type channel layer 214) is etched and the p-well 206 and n-well 204 remain intact. In an example, the dry etching process may remove from about 50 nm to about 200 nm of the channel layer 211. As such, in the illustrated embodiment of FIG. 2E, vertical bars 216-222 may have a substantially similar height "$h_1$" ranging from about 50 nm to about 200 nm. Moreover, according to the current embodiments, the vertical bars 216 and 218 formed over n-well 204 are separated by a substantially small distance "$D_1$" that is not greater than about 25 nm. Similarly, vertical bars 220 and 222 formed over p-well 206 are separated by a substantially small distance "$D_2$" that is not greater than about 25 nm.

Figure 2F:
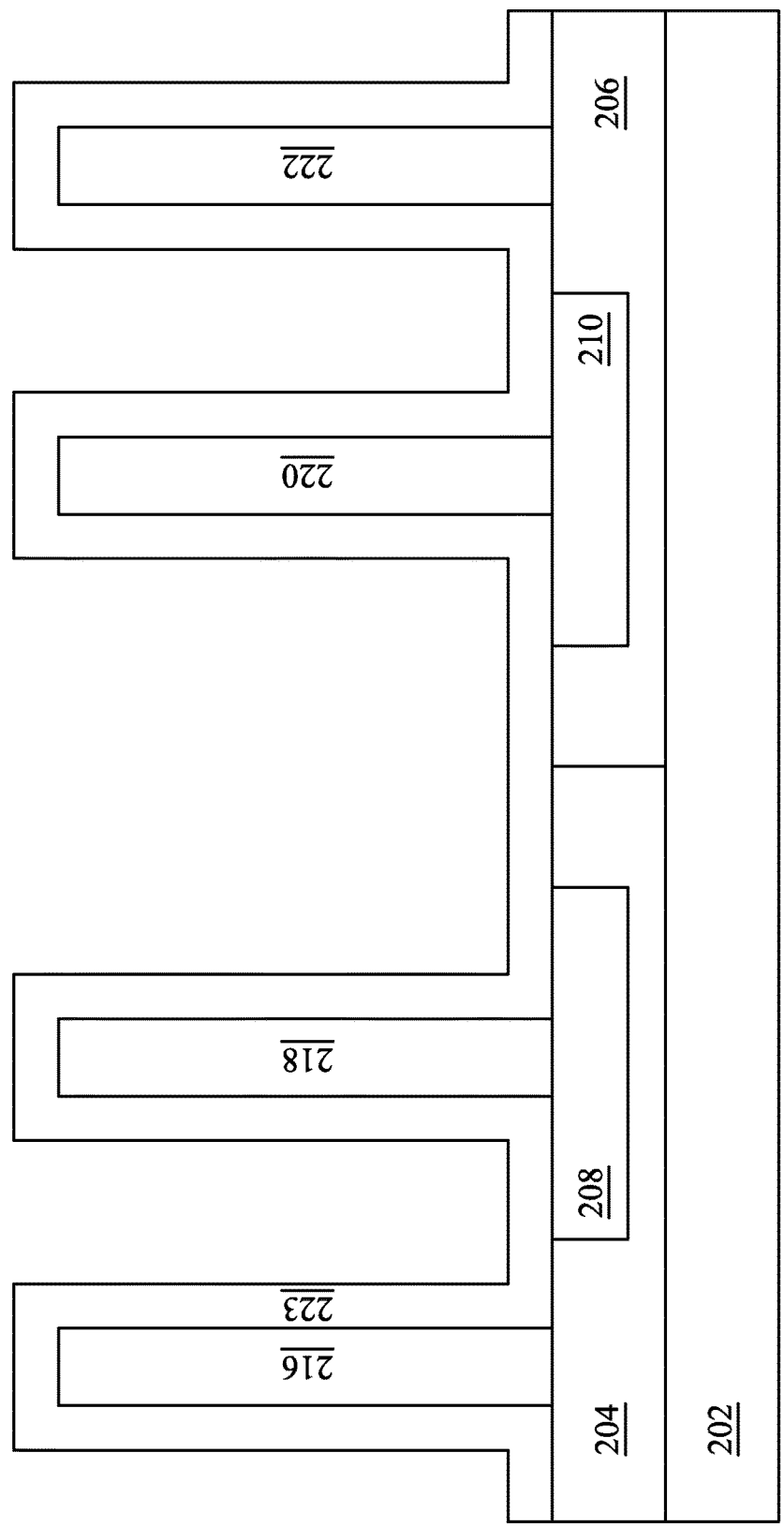

Referring now to FIGS. 1 and 2F, the method 100 proceeds to operation 110 with forming a dielectric layer 223 over sidewalls of the vertical bars 216-222 and n-well 204/p-well 206. In some embodiments, such a dielectric layer 223 may be referred to as a "liner" layer that is configured to protect sidewalls/surfaces of the vertical bars 216-222 and/or the source/drain features 208/210. The formation of the dielectric layer 223 may include one or more dielectric materials such as silicon nitride, silicon oxide, silicon carbide, silicon oxycarbide (SiOC), silicon oxycarbon nitride (SiOCN), and/or a combination thereof. The dielectric layer 223 may include a single layer or a multi-layer structure. The dielectric layer 223 may be formed by chemical oxidation, thermal oxidation, ALD, CVD, and/or other suitable methods.

Figure 2G:
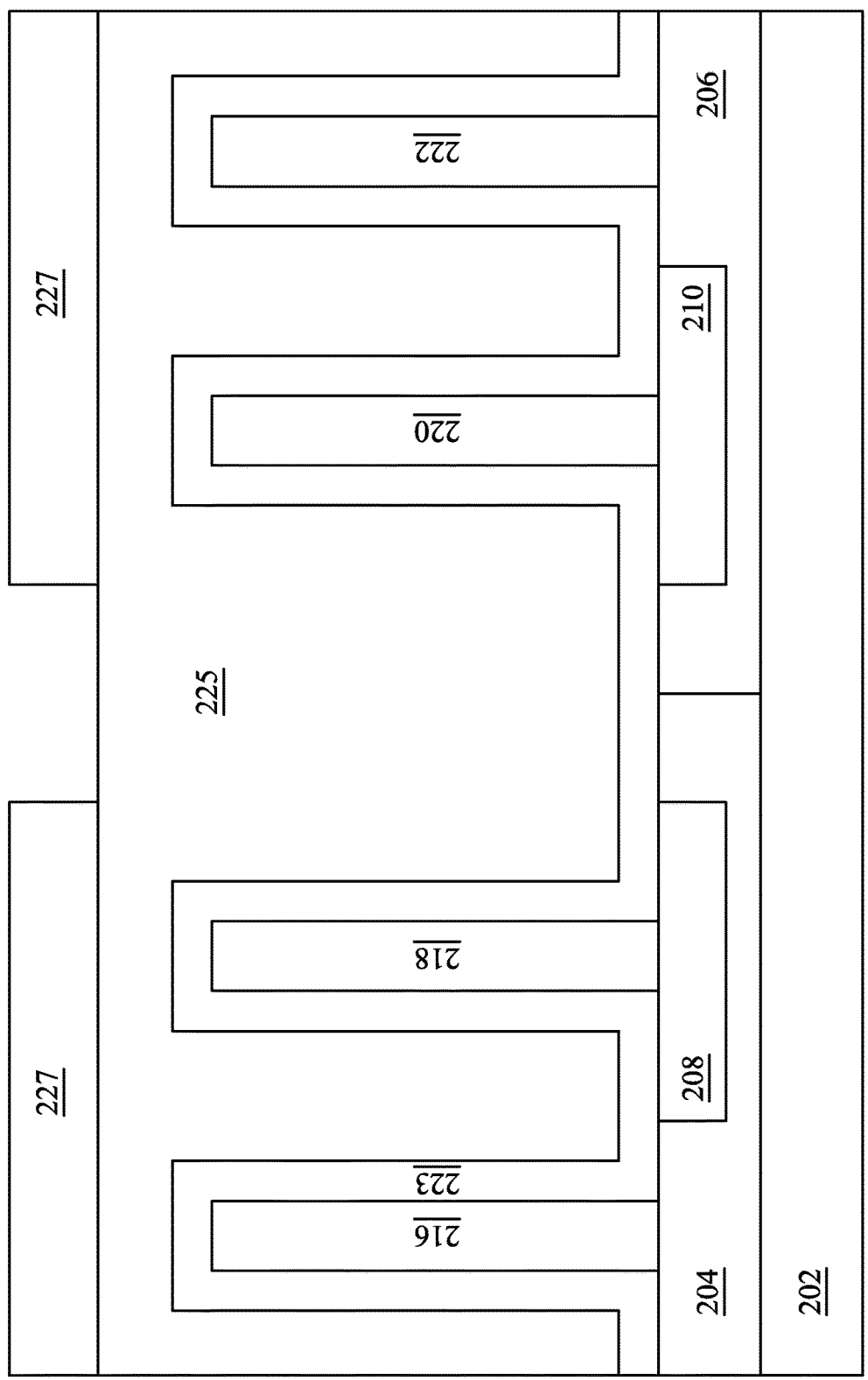
Figure 2H:
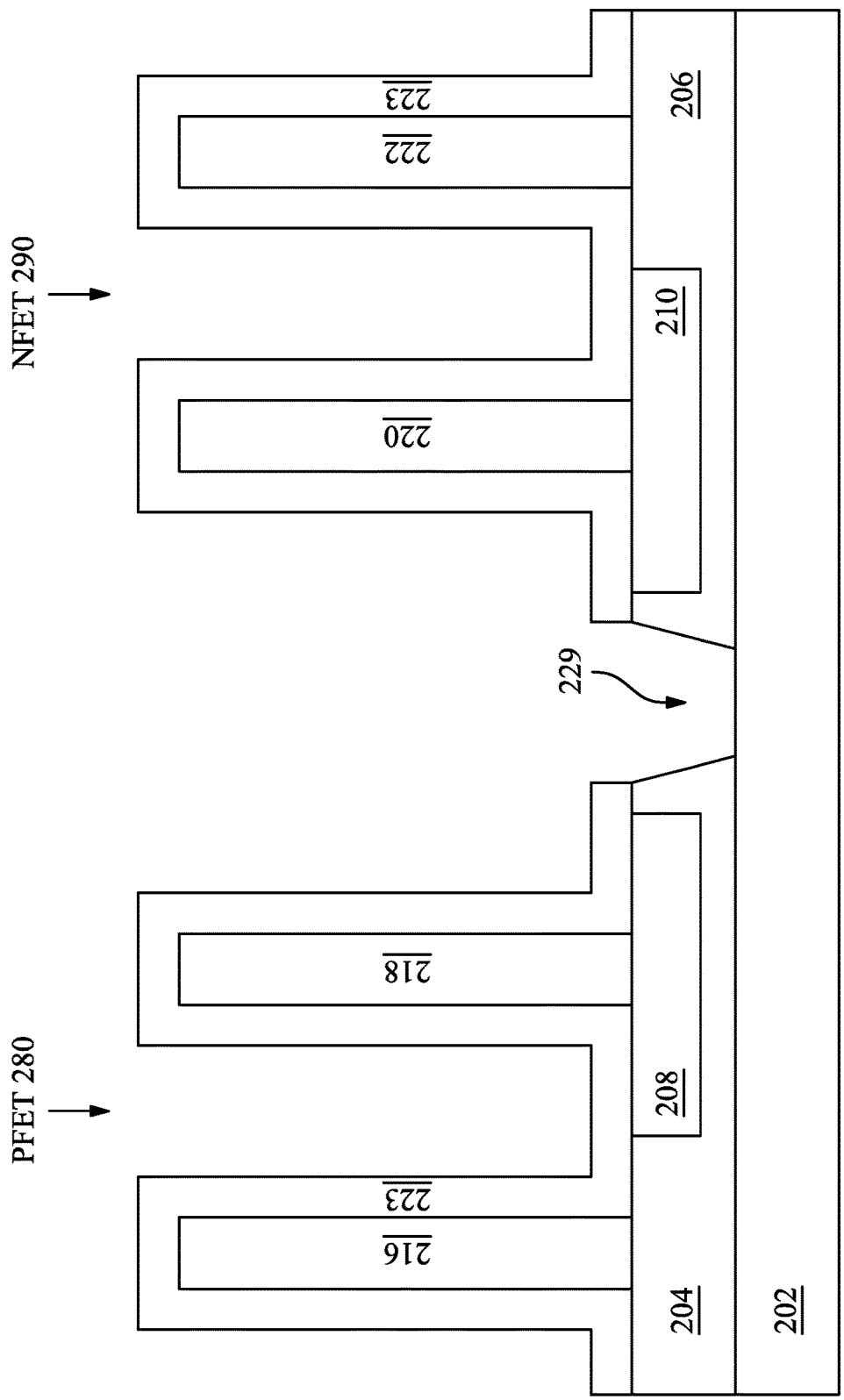

Referring now to FIGS. 1, 2G, and 2H, the method 100 proceeds to operation 112 with forming an isolation feature (e.g., a shallow trench isolation (STI)) to isolate PFET 280 and NFET 290. In the illustrated embodiment of FIG. 2H, the PFET 280 may include the vertical bars 218 and 216, the source/drain feature 208, the n-well 204, and other features/elements that will be described below; the NFET 290 may include the vertical bars 220 and 222, the source/drain feature 210, the p-well 206, and other features/elements that will be described below.

Referring still to FIGS. 2G and 2H, formation of the STI feature may include multiple process: depositing a dielectric layer 225 over the substrate, forming a patterned mask layer 227 over the dielectric layer 225, and, as illustrated in FIG. 2H, etching a portion of the n-well 204 and a portion of the p-well 206 to form trenches 229 by using the patterned mask layer 227 as an etch mask. In some embodiments, the dielectric layer 225 may be formed of a different material from the material of the dielectric layer 223. In some embodiments, after the formation of the trench 229, the dielectric layer 225 and the patterned mask layer 227 may be removed. The etching may be a dry etch process that includes a plasma etch process using $CF_4$, $SF_6$, $Cl_2$, $O_2$, other gas as an etch gas, and/or combination thereof. Moreover, the etching process to form the STI may be a selective etching process. That is, only a portion of the n-well 204 and a portion of the p-well 206 are etched and the underlying substrate 202 remains intact.

Figure 2I:
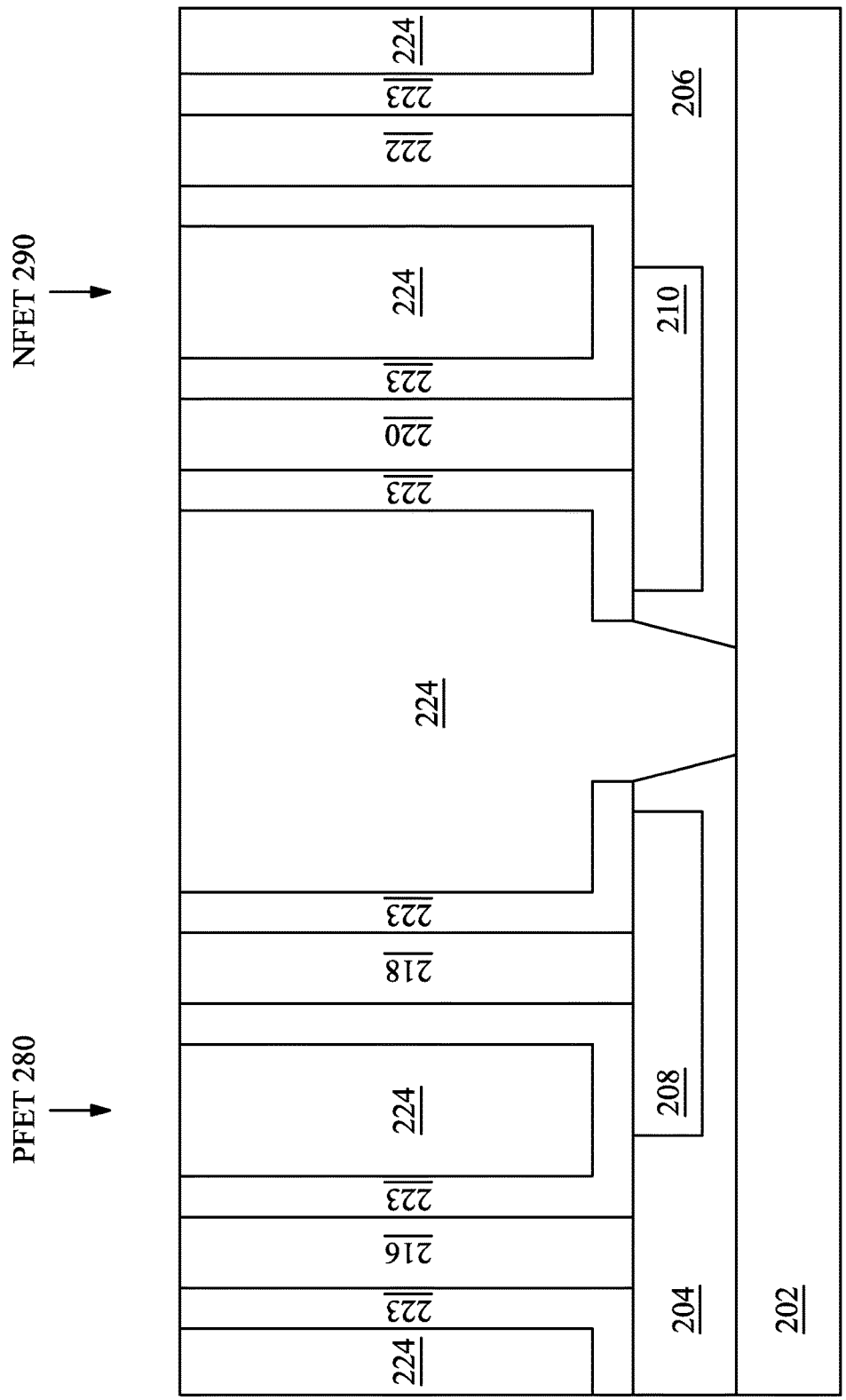

Referring now to FIG. 2I, after forming trench 229, a dielectric layer 224 may be formed to cover the PFET 280 and NFET 290. The formation of the dielectric layer 224 may include thermal oxidation of the trench 229 and then filling in the trenches 229 and further extending to cover the vertical bars 216-222. Dielectric layer 224 may include a dielectric material such as silicon oxide. In some embodiments, the dielectric layer 224 may be formed of a different material from the material of the dielectric layer 223. Moreover, as shown, a planarization process (e.g., a Chemical-Mechanical Polishing (CMP) process) may be subsequently utilized to form a substantial coplanar top surface 224a that is formed by the vertical bars 216-222, the dielectric layer 223 along the sidewalls of the vertical bars 216-222, and the dielectric layer 224.

Figure 2J:
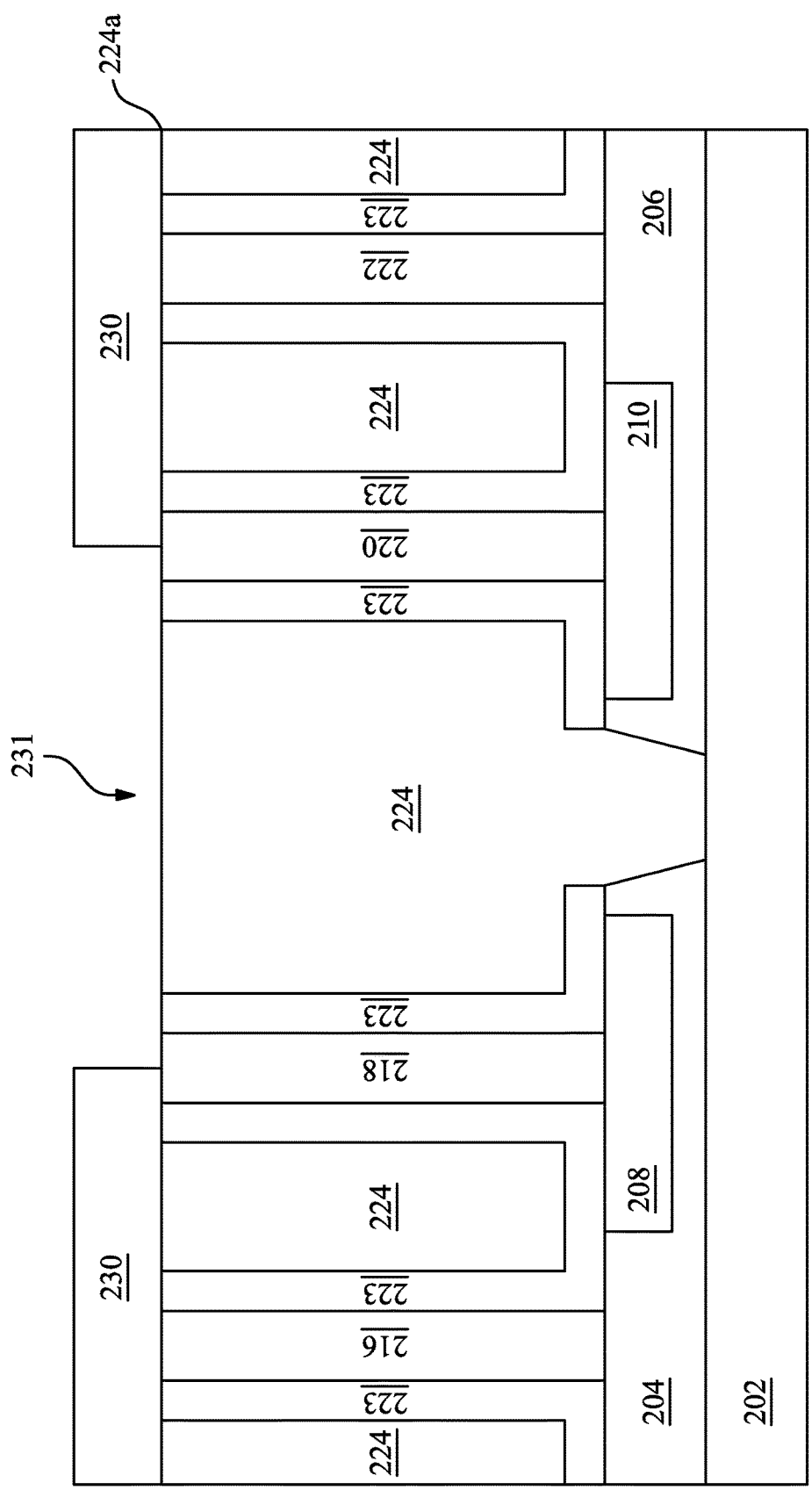
Figure 2K:
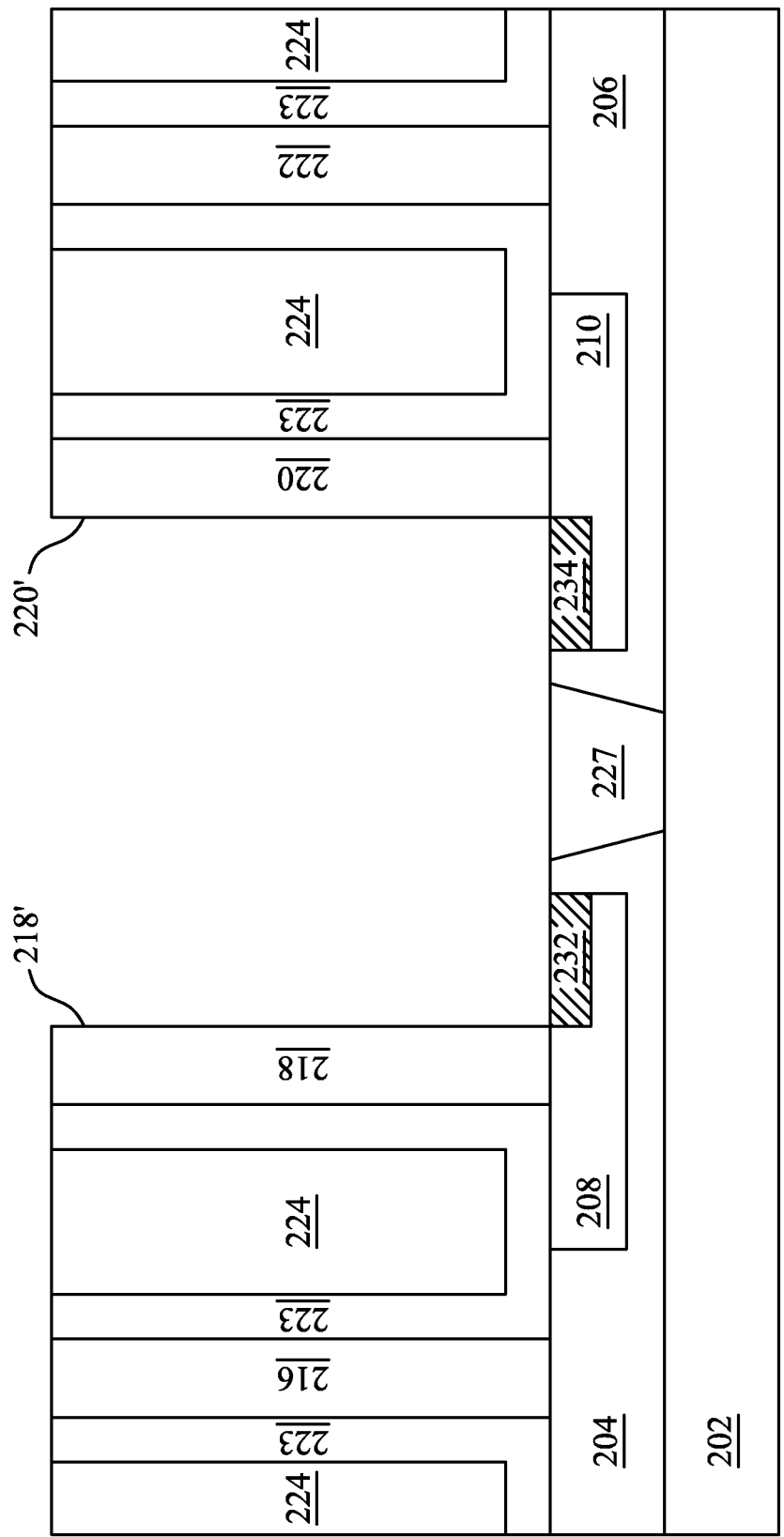

Referring now to FIGS. 1, 2J, and 2K, the method 100 proceeds to operation 114 with exposing sidewalls of the vertical bars 218 and 220. With reference to FIG. 2J, a patterned mask layer 230 (e.g., a hard mask layer) is formed over the coplanar surface 224a. The patterned mask layer 230 includes openings 231 that expose portions of dielectric layer 223 and dielectric layer 224. Using the patterned mask layer 230 as an etch mask, an etching process is applied to dielectric layers 223 and 224 through openings 231.

As illustrated in FIG. 2K, the etching process etches the portion of the dielectric layer 223 along sidewall 218' of the vertical bar 218, sidewall 220' of the vertical bar 220, and the portion of the dielectric layer 224 that is formed between the vertical bars 218 and 220. Such an etch process may be a dry etch process using $CF_4$, $H_2$, $O_2$, $N_2$, or other etch gas that is suitable to etch dielectric material(s). Further, as illustrated in FIG. 2K, after dielectric layers 223 and 224 along the sidewalls 218' and 220' are removed (etched), part of the source/drain features 208/210 may be exposed and accordingly an STI 227 may be formed. Silicide layers 232 and 234 may then be formed on/in such exposed source/drain features 208 and 210 respectively. The formation of the silicide layers 232 and 234 may include a self-aligned silicide process, an e-beam evaporation process, a sputtering process, or a combination thereof. One of a variety of materials may be used to form the silicide layer such as, for example, Pt, Pd, Co, and/or Ti.

Figure 2L:
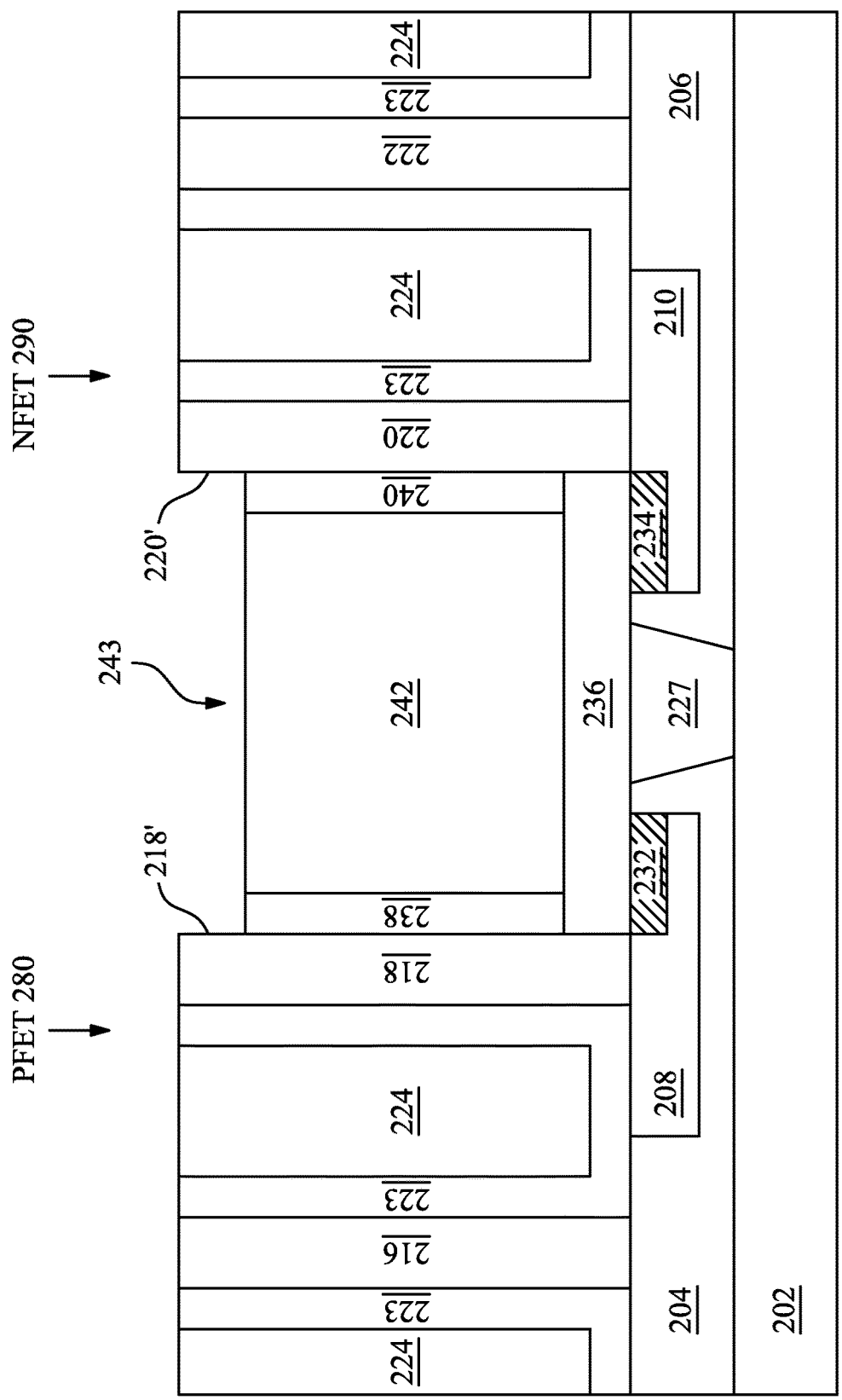

Referring now to FIGS. 1 and 2L, method 100 proceeds to operation 116 with forming a main gate feature 243 for the PFET 280 and NFET 290. As shown, main gate feature 243 is part of PFET 280 and NFET 290. That is, main gate feature 243 extends from the PFET 280 and to the NFET 290. In other embodiments, PFET 280 and NFET 290 each include a separate main gate feature.

Main gate feature 243 (or shared gate) includes a dielectric layer 236 that is configured to cover the silicide layers 232/234 and/or isolate the silicide layers 232/234 from a gate contact (e.g., 242), a high-k dielectric material layer 238 that extends along, at least in part, the sidewall 218' of the vertical bar 218, a high-k dielectric material layer 240 that extends along, at least in part, the sidewall 220' of the vertical bar 220, a conductive layer 242 formed over the high-k dielectric layers 238 and 240, and the dielectric layer 236. In some embodiments, the dielectric layer 236 may be formed of a different material (e.g., silicon nitride) from the material of 224 and 223. In some embodiments, the high-k dielectric material has a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminium oxide ($Al_2O_3$), titanium oxide ($TiO_2$), yttrium oxide, strontium titanate, hafnium oxynitride ($HfO_xN_y$), other suitable metal-oxides, or combinations thereof. The high-k dielectric material layers 238/240 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof. In some embodiments, the high-k dielectric material layer 238 and 240 may be formed separately. Regarding the conductive layer 242, by way of example, the conductive layer 242 of the main gate feature 243 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the conductive layer 242 of the main gate feature 243 may be formed by ALD, PVD, CVD, e-beam evaporation, or other suitable process. Further, the conductive layer 242 may be formed separately for the NFET 290 and the PFET 280 which may use different conductive layer(s).

Figure 2M:
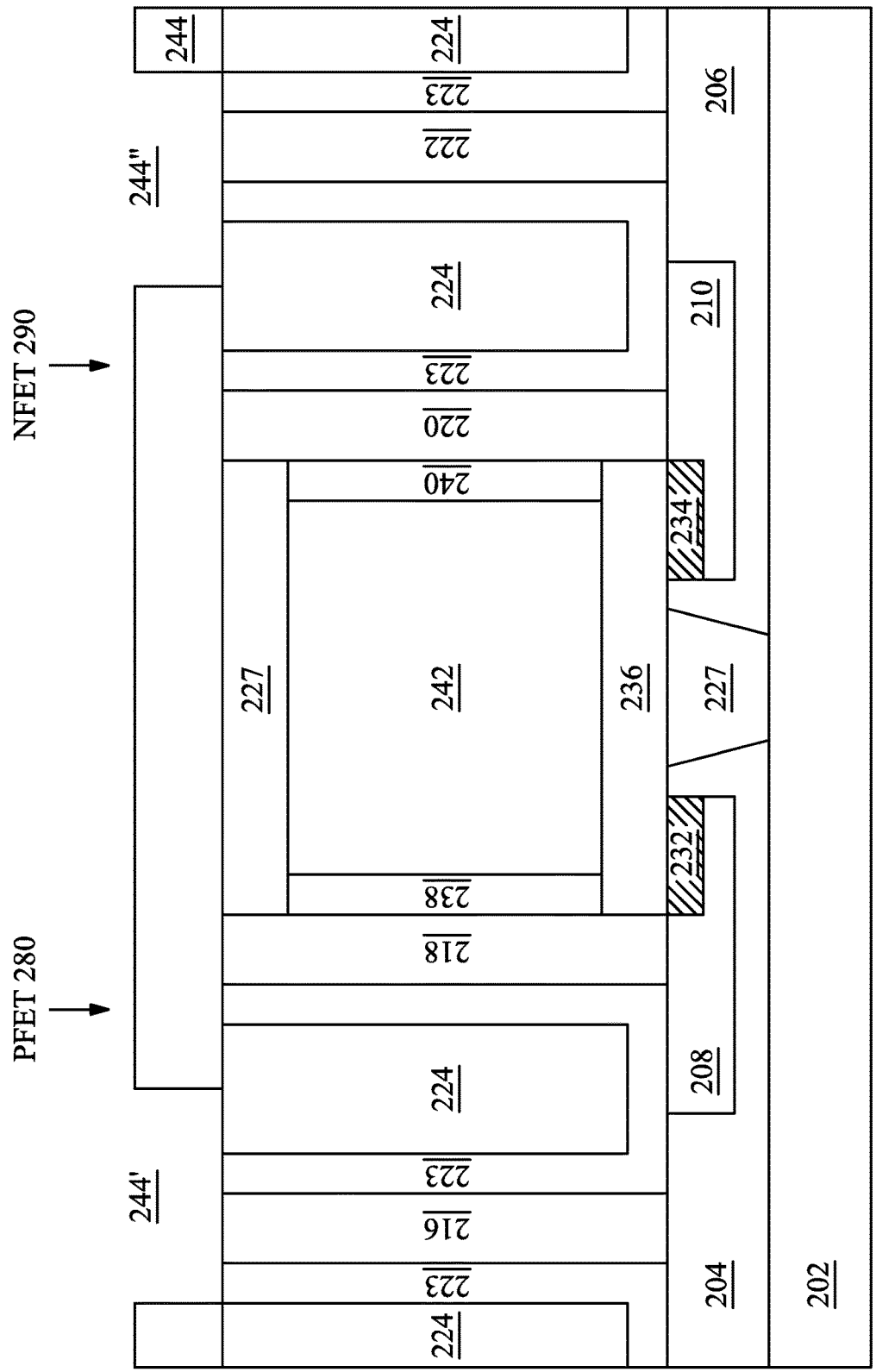

Referring now to FIGS. 1 and 2M, the method 100 proceeds to operation 118 with forming back gate features for the PFET 280 and NFET 290. The formation of the back gate features includes depositing an inter-layer dielectric (ILD) layer 227 and depositing a patterned mask layer 244 that includes opening 244' over the substrate/the ILD layer 227, implanting the vertical bar 216 of the PFET 280 through the opening 244', forming another opening 244" of the mask layer 244, implanting the vertical bar 222 of the NFET 290 through the opening 244". More specifically, the implantation of the vertical bar 216 may include using ion implantation with the same dopant to implant the source/drain feature 208 (e.g., boron), and the implantation of the vertical bar 222 may include using ion implantation with the same dopant to implant the source/drain feature 210 (e.g., phosphorous). However, a doping profile that is used to implant the vertical bars 216/222 may be different from the doping profile used for the respective source/drain feature 208/210. In some specific embodiments, a doping concentration that ranges between $1 \times 10^{18}$ $cm^{-3}$ to $1 \times 10^{20}$ $cm^{-3}$ may be used to implant the vertical bars. In some specific embodiments, the implanted vertical bar 216 may serve as a second gate (other than gate feature 243) of the PFET, and similarly, the implanted vertical bar 222 may serve as a second gate (other than gate feature 243) of the NFET.

Figure 2N:
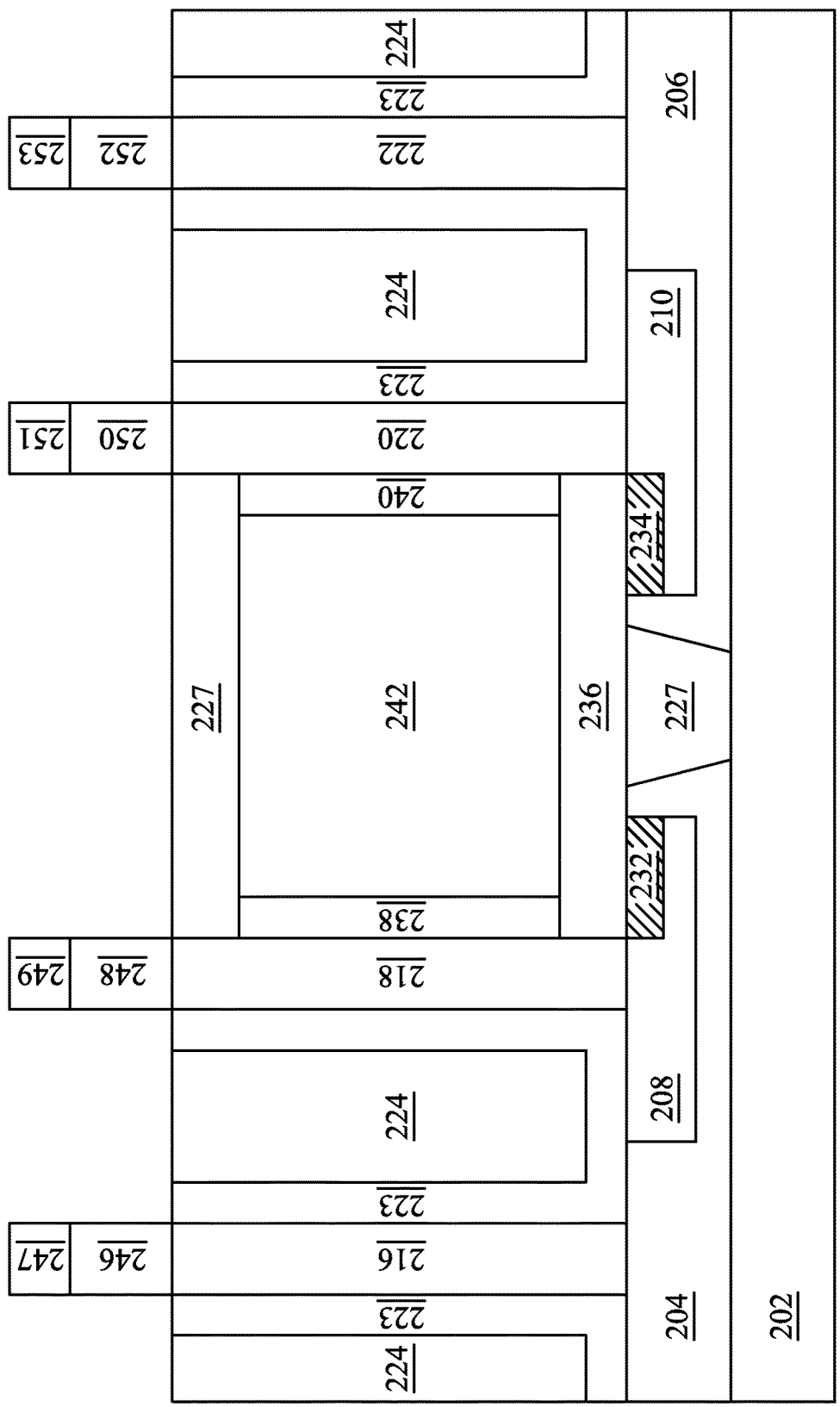
Figure 2O:
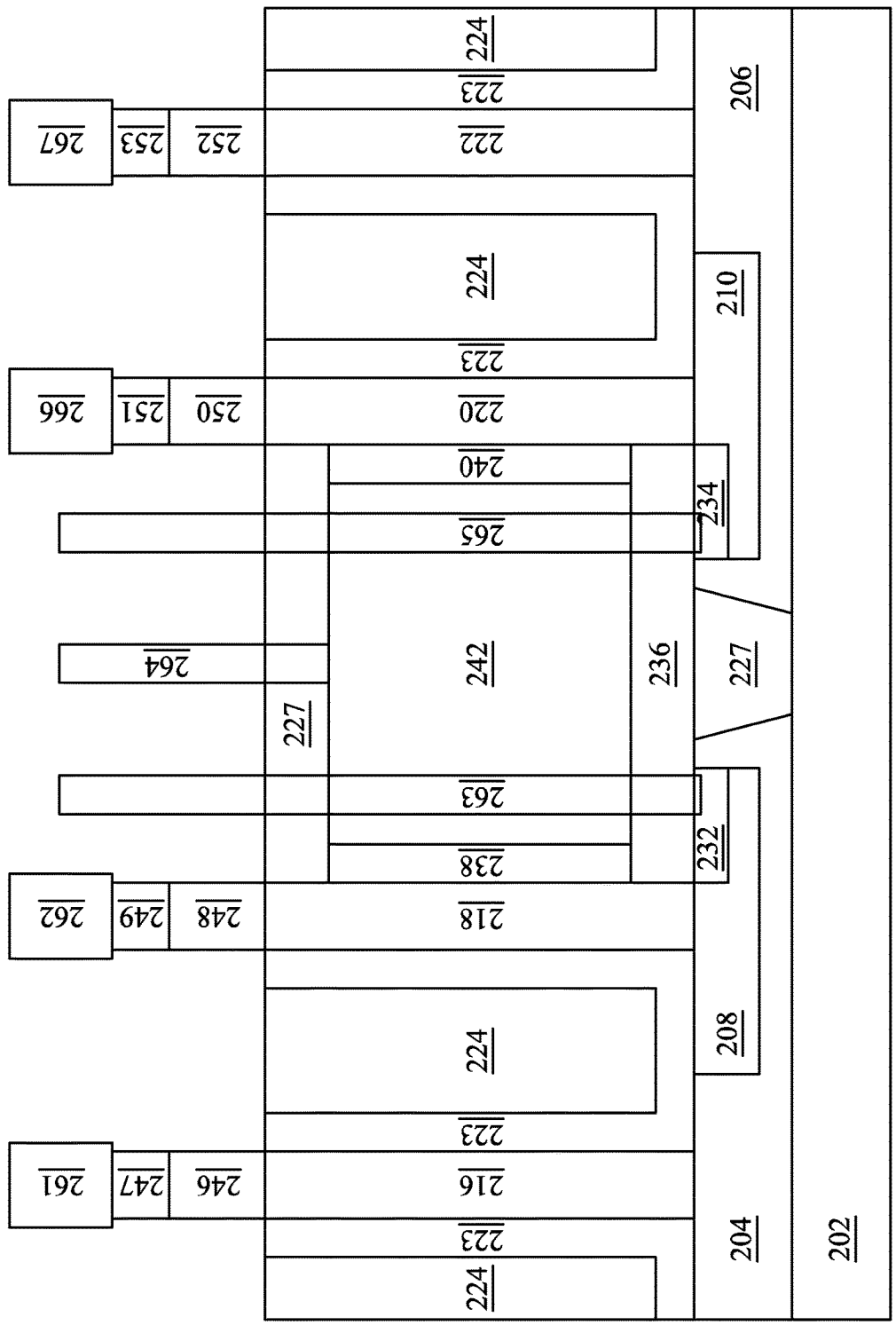

Referring to FIGS. 1 and 2N, the method 100 proceeds to operation 120 with forming drain/source features 248 and 250 for the PFET 280 and the NFET 290. The formation of the drain/source features 248 and 250 may each include epitaxially growing a raised portion on a top portion of the vertical bar 218 and 220; doping the raised portion with the respective dopant (that is, using a p-type dopant for drain/source 248 of the PFET 280 and using an n-type dopant for drain/source 250 of the NFET 290); and activating the dopants in the raised portion by an annealing process. According to current embodiments, an epitaxially grown portion (e.g., 246 and 252) on each of the tops of the back gate features 216 and 222 may be formed simultaneously or subsequently with the formation of the drain/source features 248 and 250. Moreover, after the formation of the drain/source features 248 and 250 and the epitaxially grown portions 246 and 252 of the back gate features, a silicide layer may be formed on each of the epitaxially grown portions 246, 248, 250, and 252. For example, silicide layer 247 may be formed on the epitaxially grown portion 246; silicide layer 249 may be formed on the epitaxially grown portion 248; silicide layer 251 may be formed on the epitaxially grown portion 250; silicide layer 253 may be formed on the epitaxially grown portion 252. The formations of the silicide layers 247, 249, 251, and 253 may include a self-aligned silicide process, an e-beam evaporation process, a sputtering process, or a combination thereof. One of a variety of materials may be used to form the silicide layer such as, for example, Pt, Pd, Co, and/or Ti.

As discussed above, the embodiment of the method 100 in FIG. 1 is merely an example. One or more operations may be omitted and/or added into the method 100. In an example, further operations may be included in the method 100 to form a contact for each of the formed features. In the illustrated embodiment of FIG. 2O, contact or interconnection line 261, 262, 263, 264, 265, 266, and 277 is each formed to electrically couple the formed feature. Contact 261 is formed to electrically couple the back gate feature 246/216 of the PFET 280; contact 262 is formed to electrically couple the drain/source feature 248 of the PFET 280; contact 263 is formed to electrically couple the drain/source feature 208 of the PFET 280; contact 264 is formed to electrically couple the main gate feature 243 of the PFET 280/NFET 290; contact 265 is formed to electrically couple the drain/source feature 210 of the NFET; contact 266 is formed to electrically couple the drain/source feature 250 of the NFET 290; contact 267 is formed to electrically couple the back gate feature 252/222 of the NFET 290.

Embodiments of the current disclosure provide structures and methods in which a vertical transistor is controlled by a first vertical gate and a second vertical gate. The first vertical gate may be coupled to a channel region (active region) through a high-k dielectric material layer, and the second vertical gate may be coupled to channel region through a dielectric layer (non-high-k material) and serve as a back gate the vertical transistor. Moreover, the second vertical gate may be doped individually as so to provide more flexibility of tuning a characteristic of the vertical transistor such as, for example, threshold voltage, turn-on resistance. Such a formation of the back gate feature for the vertical transistor may provide a variety of other advantages. In an example, for a vertical transistor formed by conventional approaches, the threshold voltage of the transistor is relatively limited to the selection of gate materials (that is, once the gate material is determined, the threshold voltage is not subject to change). Although some approaches that use multiple layers of gate materials may provide a dimension to tune the threshold voltage, such approaches generally involve multiple additional fabrication steps, which may in turn disadvantageously increase cost. In contrast, the current embodiments uses the formation of the vertical back gate that is substantially adjacent to the channel region (and is simultaneously formed during the formation of the channel region) to provide the flexibility of tuning the threshold voltage while without requiring multiple additional fabrication steps.

In an embodiment, a semiconductor device includes a first vertical bar structure disposed over a substrate, wherein the first vertical bar structure includes a first sidewall and an opposing second sidewall; a first gate feature disposed along the first sidewall of the first vertical bar structure such that the first gate feature is electrically coupled to the first vertical bar structure; a second vertical bar structure disposed over the substrate, wherein the second vertical bar structure is electrically coupled to the first vertical bar structure and serves as a second gate feature; a first source/drain feature disposed in the substrate below the first vertical bar structure; and a second source/drain feature disposed over the first vertical bar structure.

In another embodiment, a semiconductor device includes an n-type vertical field-effect transistor (FET) that includes: a first source/drain feature disposed in a substrate; a first vertical bar structure that includes a first sidewall and a second sidewall disposed over the substrate; a gate disposed along the first sidewall of the first vertical bar structure; a second vertical bar structure electrically coupled to the first vertical bar structure; and a second source/drain feature disposed over the first vertical bar structure; and a p-type FET that includes; a third source/drain feature disposed in the substrate; a third vertical bar structure that includes a third sidewall and a fourth sidewall disposed over the substrate; the gate disposed along the third sidewall of the third vertical bar structure; a fourth vertical bar structure electrically coupled to the third vertical bar structure; and a fourth source/drain feature disposed over the third vertical bar structure.

Yet in another embodiment, a method includes providing a semiconductor substrate that includes a first portion doped with a first type of dopants and a second portion doped with a second type of dopants, wherein the first portion includes a first source/drain feature; forming a first layer that is doped with the first type of dopants over the semiconductor substrate; patterning the first layer to form a first vertical bar structure of the first layer disposed over the first portion of the semiconductor substrate and a second vertical bar structure of the first layer disposed over the second portion of the semiconductor substrate; forming a first dielectric layer over the first and the second vertical bar structures; removing a portion of the first dielectric layer to expose a sidewall of the first vertical bar structure; forming a first transistor gate that is electrically coupled to the first vertical bar structure; forming a second transistor gate in the second vertical bar structure; and forming a second source/drain feature in a top portion of the first vertical bar structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first vertical bar structure disposed over a substrate, wherein the first vertical bar structure includes a first sidewall and an opposing second sidewall;
   a first gate feature disposed along the first sidewall of the first vertical bar structure such that the first gate feature is electrically coupled to the first vertical bar structure;
   a second vertical bar structure disposed over the substrate, wherein the second vertical bar structure is electrically coupled to the first vertical bar structure and serves as a second gate feature;
   a first source/drain feature disposed in the substrate below the first vertical bar structure; and
   a second source/drain feature disposed over the first vertical bar structure.

2. The semiconductor device of claim 1, wherein the second vertical bar structure is positioned opposite the first vertical bar structure from the first gate feature at a distance.

3. The semiconductor device of claim 2, wherein the distance is less than 25 nanometers.

4. The semiconductor device of claim 1, further comprising a first dielectric material layer disposed between the first sidewall of the first vertical bar structure and the first gate feature, wherein the first dielectric material layer is formed of a high-k dielectric material.

5. The semiconductor device of claim 1, further comprising a second dielectric material layer disposed directly on the second vertical bar structure and extending continuously to the first vertical bar structure.

6. The semiconductor device of claim 5, wherein the second dielectric material layer is not a high-k dielectric material layer.

7. The semiconductor device of claim 1, wherein the second source/drain feature is an epitaxial grown source/drain feature from the first vertical bar structure.

8. The semiconductor device of claim 1, wherein the first source/drain feature, the second source/drain feature, and the second gate feature have the same type of dopant.

9. A semiconductor device, comprising:
   an n-type vertical field-effect transistor (FET) that includes:
     a first source/drain feature disposed in a substrate;
     a first vertical bar structure that includes a first sidewall and a second sidewall disposed over the substrate;
     a gate disposed along the first sidewall of the first vertical bar structure;
     a second vertical bar structure electrically coupled to the first vertical bar structure; and
     a second source/drain feature disposed over the first vertical bar structure; and
   a p-type FET that includes;
     a third source/drain feature disposed in the substrate;
     a third vertical bar structure that includes a third sidewall and a fourth sidewall disposed over the substrate;

the gate disposed along the third sidewall of the third vertical bar structure;
a fourth vertical bar structure electrically coupled to the third vertical bar structure; and
a fourth source/drain feature disposed over the third vertical bar structure.

10. The semiconductor device of claim 9, further comprising a first high-k dielectric layer disposed between the first sidewall of the first vertical bar structure and the gate, and a second high-k dielectric layer that is disposed between the third sidewall of the third vertical bar structure and the gate.

11. The semiconductor device of claim 9, further comprising a dielectric layer disposed between the second sidewall of the first vertical bar structure and the second vertical bar structure and between the fourth sidewall of the third vertical bar structure and the fourth vertical bar structure.

12. The semiconductor device of claim 9, further comprising a shallow trench isolation feature disposed in the substrate between the n-type FET and the p-type FET.

13. The semiconductor device of claim 9, wherein the first source/drain feature, the second source/drain feature, and the second vertical bar structure of the n-type FET is each doped with n-type dopants.

14. The semiconductor device of claim 9, wherein the third source/drain feature, the fourth source/drain feature, and the fourth vertical bar structure of the p-type FET is each doped with p-type dopants.

15. A semiconductor device, comprising:
a first vertical bar structure disposed over a substrate, wherein the first vertical bar structure includes a first sidewall and an opposing second sidewall;
a first source/drain feature disposed in the substrate below the first bar structure;
a first gate disposed along the first sidewall of the first vertical bar structure;
a second vertical bar structure disposed over a substrate to form a second gate;
a second source/drain feature disposed over a top portion of the first vertical bar structure.

16. The semiconductor device of claim 15, wherein the first gate includes:
a high-k dielectric material layer formed along, at least in part, the first sidewall of the first vertical bar structure; and
a conductive layer formed on the high-k dielectric material layer.

17. The semiconductor device of claim 15, wherein the second gate includes:
the second vertical bar structure disposed over the substrate; and
a dielectric material layer formed between the first vertical bar structure and the second vertical bar structure.

18. The semiconductor device of claim 17, wherein a distance between the first vertical bar structure and the second vertical bar structure is less than 25 nanometers.

19. The semiconductor device of claim 15, wherein the second gate is a control gate for the first gate.

20. The semiconductor device of claim 15, wherein the first vertical bar structure and the second vertical bar structure have a same height.

* * * * *